United States Patent
Apalkov et al.

(10) Patent No.: US 9,384,811 B2
(45) Date of Patent: Jul. 5, 2016

(54) METHOD AND SYSTEM FOR PROVIDING A THERMALLY ASSISTED SPIN TRANSFER TORQUE MAGNETIC DEVICE INCLUDING SMART THERMAL BARRIERS

(71) Applicant: Samsung Electronics Co., LTD., Gyeonggi-do (KR)

(72) Inventors: Dmytro Apalkov, San Jose, CA (US); Roman Chepulskyy, Milpitas, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/559,536

(22) Filed: Dec. 3, 2014

(65) Prior Publication Data
US 2015/0294703 A1    Oct. 15, 2015

Related U.S. Application Data

(60) Provisional application No. 61/978,147, filed on Apr. 10, 2014.

(51) Int. Cl.
*G11C 11/15* (2006.01)
*G11C 11/16* (2006.01)
*H01L 43/02* (2006.01)
*H01L 43/08* (2006.01)

(52) U.S. Cl.
CPC .......... *G11C 11/161* (2013.01); *G11C 11/1675* (2013.01); *H01L 43/02* (2013.01); *H01L 43/08* (2013.01)

(58) Field of Classification Search
CPC ...................................... G11C 11/161
USPC ........................................... 365/158
See application file for complete search history.

(56) References Cited

U.S. PATENT DOCUMENTS

| | | |
|---|---|---|
| 6,653,704 B1 | 11/2003 | Gurney |
| 7,408,217 B2 | 8/2008 | Yoon |
| 7,615,771 B2 | 11/2009 | Fontana, Jr. |
| 8,203,865 B2 | 6/2012 | Tian |
| 8,264,868 B2 | 9/2012 | Ribeiro |
| 8,298,905 B2 | 10/2012 | Ito |
| 8,310,866 B2 | 11/2012 | Leuschner |
| 8,482,967 B2 | 7/2013 | Xi |
| 8,698,259 B2* | 4/2014 | Krounbi ............... H01L 43/08 365/158 |
| 2005/0023559 A1 | 2/2005 | Ogimoto |
| 2011/0043141 A1 | 2/2011 | Kim |
| 2011/0108937 A1* | 5/2011 | Reid .................... B82Y 25/00 257/421 |
| 2012/0106245 A1 | 5/2012 | Mackay |
| 2012/0230089 A1 | 9/2012 | Yamada |

(Continued)

FOREIGN PATENT DOCUMENTS

WO    2013182701 A1    12/2013

*Primary Examiner* — Son Mai
(74) *Attorney, Agent, or Firm* — Convergent Law Group LLP

(57) ABSTRACT

A magnetic device usable in electronic devices is described. The magnetic device includes a magnetic junction and at least one smart thermal barrier that is thermally coupled with the magnetic junction. The magnetic junction includes at least one reference layer, at least one nonmagnetic spacer layer and a free layer. The nonmagnetic spacer layer(s) are between the reference layer(s) and the free layer. The free layer is switchable between stable magnetic states when a write current passed through the magnetic junction. The smart thermal barrier has a low heat conductance below a transition temperature range, and a high heat conductance above the transition temperature range.

20 Claims, 6 Drawing Sheets

(56) References Cited

U.S. PATENT DOCUMENTS

| | | |
|---|---|---|
| 2013/0134382 A1 | 5/2013 | Martens |
| 2013/0182499 A1 | 7/2013 | Prejbeaunu |
| 2013/0187113 A1 | 7/2013 | Martens |
| 2013/0207069 A1 | 8/2013 | Pickett |
| 2015/0270481 A1* | 9/2015 | Annunziata ............ H01L 43/08 257/421 |

* cited by examiner

Drive Write Current Through Junction With Free Layer Temperature Above Transition Temperature Range — 402

Heat Free Layer to Write Temperature >T1, > Transition Temp. Range and <T2 — 412

Drive Current Through Junction With Free Layer Temperature Above T1 and Held Below T2 by Smart Thermal Barrier — 414

METHOD AND SYSTEM FOR PROVIDING A THERMALLY ASSISTED SPIN TRANSFER TORQUE MAGNETIC DEVICE INCLUDING SMART THERMAL BARRIERS

CROSS-REFERENCE TO RELATED APPLICATIONS

This application claims the benefit of provisional Patent Application Ser. No. 61/978,147, filed Apr. 10, 2014, entitled THERMAL ASSIST MAGNETIC TUNNEL JUNCTION WITH METAL INSULATOR TRANSITION FUSE, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO. Alternatively, a conductive layer may be used instead of the conventional tunneling barrier layer 18.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Further, other versions of the conventional MTJ 10 might include an additional pinned layer (not shown) separated from the free layer 20 by an additional nonmagnetic barrier or conductive layer (not shown).

The conventional free layer 20 has a changeable magnetization 21. To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. For example, mechanisms for improving the performance of STT-RAM are desired. Accordingly, what is needed is a method and system that may improve the performance of the spin transfer torque based memories. The method and system described herein address such a need.

BRIEF SUMMARY OF THE INVENTION

A magnetic device usable in electronic devices is described. The magnetic device includes a magnetic junction and at least one smart thermal barrier that is thermally coupled with the magnetic junction. The magnetic junction includes at least one reference layer, at least one nonmagnetic spacer layer and a free layer. The nonmagnetic spacer layer(s) are between the reference layer(s) and the free layer. The free layer is switchable between stable magnetic states when a write current passed through the magnetic junction. The smart thermal barrier has a low heat conductance below a transition temperature range, and a high heat conductance above the transition temperature range.

DETAILED DESCRIPTION OF THE INVENTION

Figure 1:
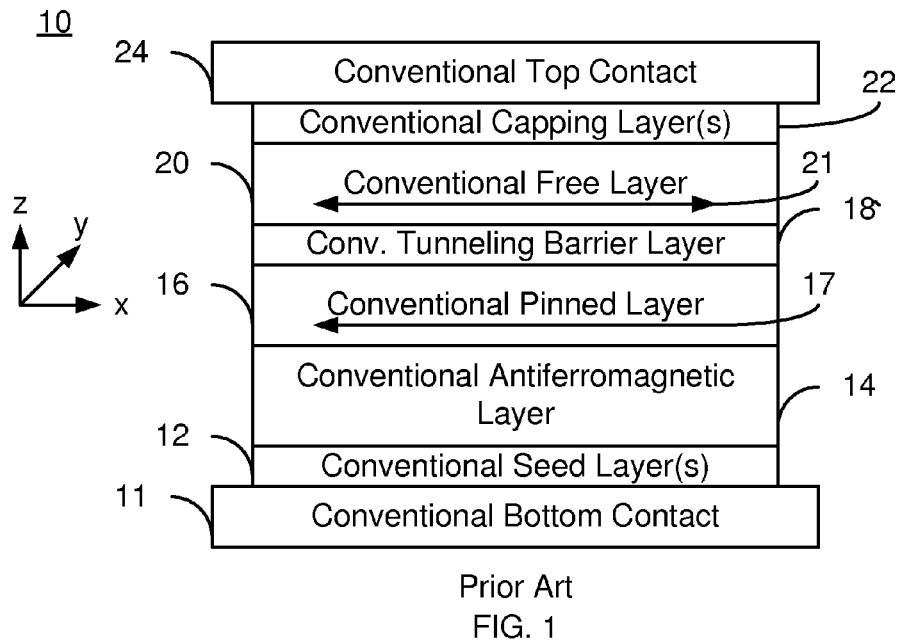
FIG. 1 depicts a conventional magnetic junction.

The exemplary embodiments relate to magnetic junctions usable in electronic devices, such as those using magnetic memories, and other devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments include magnetic device having magnetic junction(s) used in connection with smart thermal barrier(s). For example, the magnetic device(s) may be within magnetic storage cells for a magnetic memory programmable using spin transfer torque. The magnetic memories may be usable in electronic devices that make use of nonvolatile storage. Such electronic devices include but are not limited to cellular phones, tablets, and other mobile computing devices. A method and system for providing a magnetic device usable in an electronic device are described. The magnetic device includes a magnetic junction and at least one smart thermal barrier that is thermally coupled with the magnetic junction. The magnetic junction includes at least one reference layer, at least one nonmagnetic spacer layer and a free layer. The nonmagnetic spacer layer(s) are between the reference layer(s) and the free layer. The free layer is switchable between stable magnetic states when a write current passed through the magnetic junction. The smart thermal barrier has a low heat conductance below a transition temperature range, and a high heat conductance above the transition temperature range.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic devices and substructures. However, one of ordinary skill in the art will readily recognize that the method and system are consistent with the use of magnetic memories having multiple magnetic devices, multiple magnetic junctions and/or using multiple substructures. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
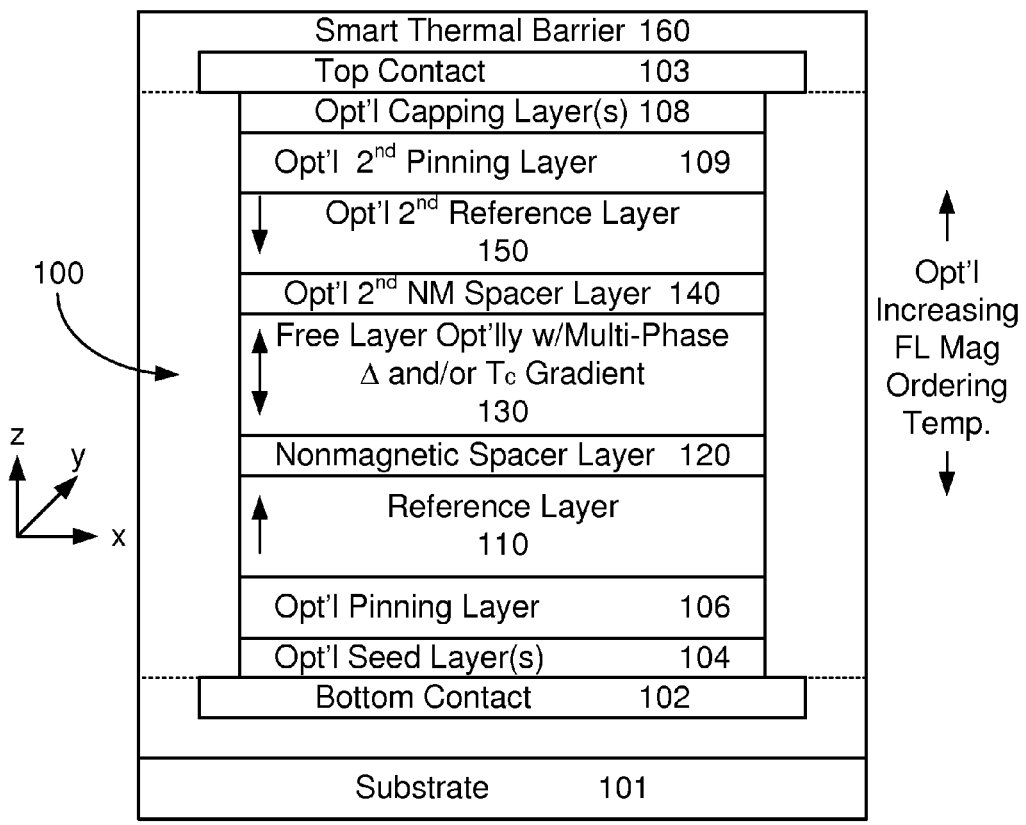
FIG. 2 depicts an exemplary embodiment of a magnetic device usable in a magnetic memory and including a magnetic junction programmable using spin transfer torque and smart thermal barrier(s).
Figure 3:
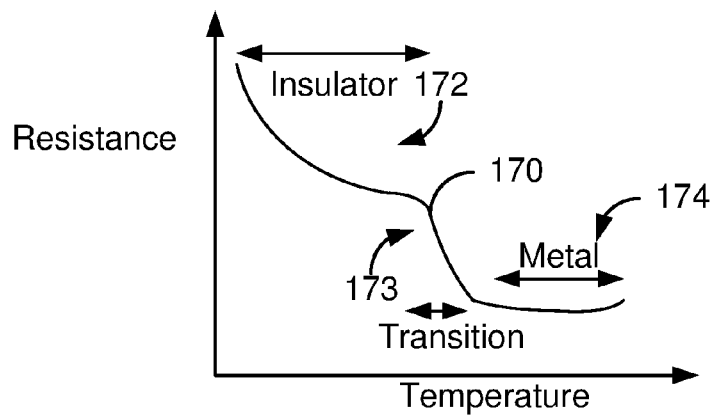
FIG. 3 is a graph depicting an embodiment of the resistance versus temperature for one embodiment of a smart thermal barrier.

FIG. 2 depicts an exemplary embodiment of a magnetic device including magnetic junction 100, at least one smart thermal barrier 160, as well as surrounding structures. For clarity, FIG. 2 is not to scale. FIG. 3 is a graph depicting the resistivity versus temperature for the smart thermal barrier(s) 160. Referring to FIGS. 2-3, although particular slopes and shapes are shown in FIG. 3, the curve is for explanatory purposes only and not meant to represent particular data unless specifically noted.

The magnetic junction 100 may be used in a device such as a spin transfer torque random access memory (STT-RAM) and, therefore, in a variety of electronic devices. The magnetic junction 100 includes a reference layer 110, a nonmagnetic spacer layer 120, a free layer 130 and optional additional nonmagnetic spacer layer 140 and an optional additional reference layer 150. The magnetic junction 100 may also include optional seed layer(s) 104, optional pinning layer 106 for reference layer 110, optional pinning layer 109 for optional reference layer 150 and optional capping layer(s) 108. Also shown is an underlying substrate 101, bottom contact 102 and optional top contact. Devices including but not limited to a transistor may be formed in the substrate 101. If the layers 140 and 150 are omitted, the magnetic junction 100 is a single magnetic junction. If layers 140 and 150 are included, the magnetic junction 100 is a dual magnetic junction. Although layers 110, 120, 130, 140 and 150 are shown with a particular orientation with respect to the substrate 101, this orientation may vary in other embodiments. For example, the reference layer 110 may be closer to the top (furthest from a substrate) of the magnetic junction 100. In such an embodiment (in which layers 140, 150 and 109 are also omitted), the magnetic junction 100 would be a bottom free layer junction. If the reference layer 110 is closest to the substrate 101 and layers 140, 150 and 109 are omitted, the magnetic junction is a top free layer junction. The optional pinning layer(s) 106 and 109 may be used to fix the magnetization of the reference layer(s) 110 and 150, respectively. In some embodiments, the optional pinning layers 106 and 109 may be AFM layers or multilayers that pin the magnetizations of the pinned layers 110 and 150, respectively, by an exchange-bias interaction. However, in other embodiments, the optional pinning layers 106 and 109 may be omitted or another structure may be used. For example, if the perpendicular magnetic anisotropy energy of the reference layer 110 exceeds the out of plane demagnetization energy, the magnetic moment of the reference layer 110 may be out of plane (e.g. perpendicular-to-plane). This situation is shown in FIG. 2. In such embodiments, the pinning layer 106 may be omitted. Similarly, the magnetic moment of the optional reference layer 150 may be out-of-plane (e.g. perpendicular-to-plane) of the perpendicular magnetic anisotropy energy of the layer 150 exceeds the out-of-plane demagnetization energy. The magnetic junction 100 is also configured to allow the free layer 130 to be switched between stable magnetic states when a write current is passed through the magnetic junction 100. Thus, the free layer 130 is switchable utilizing spin transfer torque.

The reference layer 110 is magnetic and may have its magnetization pinned, or fixed, in a particular direction. Although depicted as a simple layer, the reference layer 110 may include multiple layers. For example, the reference layer 110 may be a SAF including magnetic layers antiferromagnetically or ferromagnetically coupled through thin nonmagnetic layers, such as Ru. The magnetic layer(s) may include sublayers. The reference layer 110 may also be another multilayer. In the embodiment depicted in FIG. 2, the reference layer 110 has a perpendicular anisotropy energy that exceeds the out-of-plane demagnetization energy. Thus, the reference layer 110 may have its magnetic moment oriented perpendicular-to-plane as shown. Other orientations of the magnetization of the reference layer 110 are possible. In other embodiments, for example, the magnetic moment of the reference layer 110 may be in-plane. The optional reference layer 150 is analogous to the reference layer 110. Thus, the optional reference layer 150 is magnetic and may have its magnetization pinned, or fixed, in a particular direction. Although depicted as a simple layer, the optional reference layer 150 may include multiple layers. For example, the optional reference layer 150 may be a SAF or other multilayer. In the embodiment depicted in FIG. 2, the optional reference layer 150 has a perpendicular anisotropy energy that exceeds the out-of-plane demagnetization energy. Thus, the optional reference layer 150 may have its magnetic moment oriented perpendicular-to-plane as shown. Other orientations of the magnetization of the optional reference layer 150 are possible. In other embodiments, for example, the magnetic moment of the optional reference layer 150 may be in-plane. There is no requirement that the reference layer 110 and the optional reference layer 150 be the same in a magnetic junction in which both are present. Further, the magnetic moments of the reference layers 110 and 150 are shown in a dual (antiparallel) state. In other embodiments, the magnetic moments may be in an antidual (parallel) state. In other embodiments, the magnetic moments of the reference layers 110 and 150 may be switched between the dual and antidual states for writing and reading, respectively. Other orientations may also be used.

The spacer layer 120 is nonmagnetic. In some embodiments, the spacer layer 120 is an insulator, for example a tunneling barrier. In such embodiments, the spacer layer 120 may include crystalline MgO, which may enhance the TMR of the magnetic junction as well as the perpendicular magnetic anisotropy of the free layer 130. In other embodiments, the spacer layer 120 may be a conductor, such as Cu. In alternate embodiments, the spacer layer 120 might have another structure, for example a granular layer including conductive channels in an insulating matrix. The optional spacer layer 140 is analogous to the spacer layer 120. Thus, the optional spacer layer 140 is nonmagnetic and may be a tunneling barrier. In such embodiments, the spacer layer 140 may include crystalline MgO. In other embodiments, the spacer layer 140 may be a conductor, such as Cu. In alternate embodiments, the spacer layer 140 might have another structure, for example a granular layer including conductive channels in an insulating matrix. There is, however, no requirement that the spacer layers 120 and 140 be the same if both are present in the magnetic junction 100.

The free layer 130 is magnetic and is written using a current driven through the magnetic junction 100. In some embodiments, the free layer 130 is a multilayer. For example, the free layer 130 maybe a SAF and/or may include multiple adjoining ferromagnetic layers that are exchange coupled. Each of these ferromagnetic layers may include sublayers. Other multilayers may also be used. The layers in the multilayer may be single elements, alloys, and may include nonmagnetic layers. In other embodiments, the free layer 130 may be a single layer. In the embodiment depicted in FIG. 2, the free layer 130 has a perpendicular anisotropy energy that exceeds the out-of-plane demagnetization energy. Thus, the free layer 130 may have its magnetic moment oriented perpendicular-to-plane as shown. Because this magnetic moment is switchable, it is depicted as a dual headed arrow in FIG. 2. In other embodiments, other directions are possible for the magnetic moment of the free layer 130. For example, the free layer 130 may have its magnetic moment stable in-plane or at an angle from the z-direction.

The free layer 130 is thermally stable when the magnetic junction 100 is not being written (quiescent/in standby mode). The free layer 130 is also characterized by a magnetic thermal stability coefficient, $\Delta = K_u V/k_B T$ and a critical temperature, $T_c$, at which magnetic moment is unstable or goes to zero (e.g. the Curie temperature). $K_u V$ is the an expression for the (temperature dependent) energy barrier for switching of the magnetic moment and $k_b$ is the Boltzman constant. In some embodiments, therefore, the magnetic thermal stability coefficient, $\Delta$, of the free layer 130 is at least sixty at non-programming operating temperatures, or standby temperatures. In some such embodiments, the magnetic thermal stability coefficient is at least eighty up to a preselected standby temperature. This standby temperature is above room temperature. In some embodiments, this standby temperature is at least eighty-five degrees Celsius. During writing, however, the free layer 130 is heated. This heating may be accomplished using only the write current driven through the magnetic junction 100 or by using the write current in combination with another heat source. The free layer 130 is written at an elevated temperature.

The magnetic thermal stability coefficient, Δ, of the free layer 130 decreases with increasing temperature. Thus, the magnetic thermal stability coefficient of the free layer 130 is below eighty during writing. In some embodiments, the magnetic thermal stability coefficient of the free layer 130 is desired to be not more than forty during writing. Thus, the free layer 130 may be written at temperatures on the order of one-hundred fifty degrees Celsius or higher. However, the magnetic thermal stability coefficient of the free layer 130 is also desired to be above zero during writing. In some embodiments, the magnetic thermal stability coefficient is desired to be at least twenty at temperature achieved during writing. In some embodiments, the magnetic thermal stability coefficient is at least twenty and not more than twenty-five during at least a portion of the write operation.

The magnetic device also includes a smart thermal barrier 160. The smart thermal barrier 160 may be located at various around the magnetic junction 100. Some such positions are indicated by dashed lines in FIG. 2. The smart thermal barrier 160 has a low thermal conductivity up to a particular temperature range (transition temperature range). Above the transition temperature range, the smart thermal barrier 160 has a high thermal conductivity. The transition temperature range may be small (less than a degree) or large (occupying several degrees or tens of degrees). In general, however, a smaller transition temperature range is desired. For example, in some embodiments, the transition temperature range is not more than fifty degrees Celsius. In some such embodiments, the transition temperature range is not more than twenty degrees Celsius. The transition temperature range may be five degrees Celsius or less. In some embodiments, a high thermal conductivity is at least 1 W/mK and not more than 500 W/mK. In general, a high thermal conductivity is at least twice the low thermal conductivity. In some embodiments, the high thermal conductivity is not more than five hundred times the low thermal conductivity. For example, a high thermal conductivity may be at least fifty and not more than one hundred multiplied by the low thermal conductivity.

In some embodiments, the change in thermal conductivity may be based on a transition between insulating and metallic behavior of the smart thermal barrier 160. For example, the Fermi level of the material(s) used for the smart thermal barrier 160 may be in a band gap at low temperatures. As such, the smart thermal barrier 160 may be an insulator. At higher temperatures, the band structure of the smart thermal barrier 160 may change. The Fermi energy may then intersect the band. Consequently, the smart thermal barrier 160 may be a metal for higher temperatures. Thus, the smart thermal barrier 160 transitions from insulator to metal at the transition temperature range.

For example, FIG. 3 is a graph of one embodiment of a curve 170 depicting resistance versus temperature for the smart thermal barrier 160. Note that the scales for temperature and resistivity may differ. For example, resistivity might be shown in a logarithmic scale while temperature may be shown in a linear scale. However, other scales are possible. In region 172, below the transition temperature range 173, the smart thermal barrier 160 is an insulator. Above the transition temperature range 173 in region 174, the smart thermal barrier 160 behaves as a metal. Because they are good electrical conductors having low resistivity, metals are generally good conductors of heat. For similar reasons, insulators are generally poor conductors of heat. Thus, for the smart thermal barrier 160 corresponding to curve 170, lower temperatures correspond to a low thermal conductivity and higher temperatures correspond to higher thermal conductivity.

Because the smart thermal barrier 160 transitions from low to high thermal conductivity, at higher temperatures, the smart thermal barrier 160 may be used as a heat sink. Once the magnetic junction 100 and smart thermal barrier 160 reach a particular temperature above the transition temperature range, the smart thermal barrier 160 may carry heat away from the magnetic junction 100 for dissipation by the smart thermal barrier 160 or other structure. This higher temperature may be substantially maintained because excess heat is sunk via the smart thermal barrier 160.

For a read operation, a read current may be driven through the magnetic junction 100 and the state determined based on magnetoresistance. The minimum magnetic thermal stability coefficient for standby (Δ) is selected such that the free layer 130, and thus the magnetic junction 100, remain stable during a read operation. Thus, a read operation generally does not change the state of the magnetic junction 100.

In a write operation, a write current is driven through the magnetic junction 100 in the current perpendicular-to-plane (CPP) configuration to program the magnetic junction 100. In FIG. 2, the write current is driven between the contacts 101 and 103, substantially in the z-direction. The write current alone or in addition to heat from another source heats the magnetic junction 100 and smart thermal barrier 160 that is thermally coupled to the magnetic junction. In some embodiments, an additional line or heater (not shown in FIG. 2) is used to heat the magnetic junction 100 being programmed. During writing, the free layer 130 reaches temperature(s) corresponding to the desired magnetic thermal stability constant, discussed above. In addition, the temperature of the smart thermal barrier 160 is raised above the transition temperature range. The smart thermal barrier 160 thus transitions to a high thermal conductivity (e.g. metal) state. The smart thermal barrier 160 may then carry heat from the magnetic junction 100 so that the free layer 130 is not heated above a desired write temperature. A desired write temperature range may be better maintained for the free layer 130. Because the desired temperature of the free layer 130 may be better controlled, the magnetic stability of the free layer 130 may be more closely regulated. For example, the free layer 130 may have a reduced magnetic thermal coefficient Δ that remains not only greater than zero, but also in a desired range. Because the magnetic thermal stability coefficient Δ is reduced below its standby value, switching of the magnetic moment of the free layer 130 may be achieved faster and at a lower write current. Because the magnetic thermal stability coefficient Δ is maintained within a desired range greater than zero, the magnetic moment of the free layer 130 is less likely to switch back during cooling of the free layer. Programming of the magnetic junction may be accomplished more reliably. Thus, performance of the magnetic device may be enhanced.

The magnetic thermal stability constant Δ and/or the critical temperature of the free layer 130 may also be configured to further improve thermally assisted spin transfer switching of the free layer 130. For example, the free layer 130 may have a multi-phase magnetic thermal stability coefficient. As used herein a multi-phase magnetic thermal stability coefficient has multiple phases for which the magnetic thermal stability coefficient is greater than zero. The magnetic thermal stability coefficient may also be zero above a particular critical temperature. However, this portion of the magnetic thermal stability coefficient is not considered to be part of the multi-phase behavior. Different phases are separated by phase transition(s). The slopes of the phases of the magnetic thermal coefficient differ at the temperature corresponding to the phase transition. If the magnetic thermal stability coefficient has a first phase below a first temperature and a second phase above the first (phase transition) temperature, the first temperature is a phase transition temperature. The slopes of the first and second phases are not equal at the first temperature (the phase transition temperature. In other words, the (first) slope of the magnetic thermal stability coefficient (for the first phase) just below the first temperature is different from the (second) slope of the magnetic thermal stability coefficient (for the second phase) just above the first temperature. The slope of the magnetic thermal stability coefficient may thus be considered to be discontinuous at this temperature. Stated differently, the magnetic thermal stability coefficient has a sharp transition between the first and second phases. The magnetic thermal stability coefficient may include more than two phases. For example, the magnetic thermal stability coefficient might include three or more phases. Different phases are separated by phase transitions analogous to that described above and have magnitudes greater than zero. In addition to having multiple phases, the slopes (magnitude of $\Delta$ versus temperature) of a first phase and a second phase differ. At least a portion of the slope of the first phase is more negative than at least a portion of the slope of the second phase. The slope of the first phase generally has a larger magnitude than the slope of the second phase. In some embodiments, this means that the total change in the magnetic thermal stability constant for the first phase from room temperature to the phase transition temperature divided by the change in temperature (total change in $\Delta$ for phase 1/(phase transition temperature–room temperature)) is greater than the total change in the magnetic thermal stability constant for the second phase from the first phase transition temperature to the second phase transition temperature or critical temperature divided by the change in temperature for the over the second phase (total change in $\Delta$ for phase 2/(phase transition temperature or critical temperature–room temperature)). In other words, the magnetic thermal stability coefficient $\Delta$ changes more rapidly for the first phase than for the second phase.

Figure 4A:
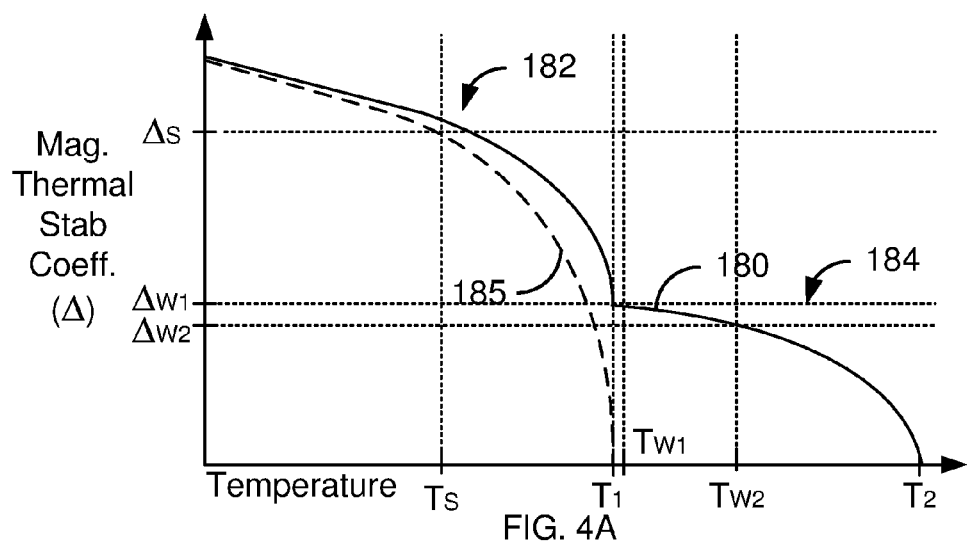
FIGS. 4A and 4B are graphs depicting embodiments of the magnetic thermal stability coefficient versus temperature for an embodiment of a magnetic junction and magnetic thermal stability coefficient versus time for a write operation for the magnetic junction.
Figure 4B:
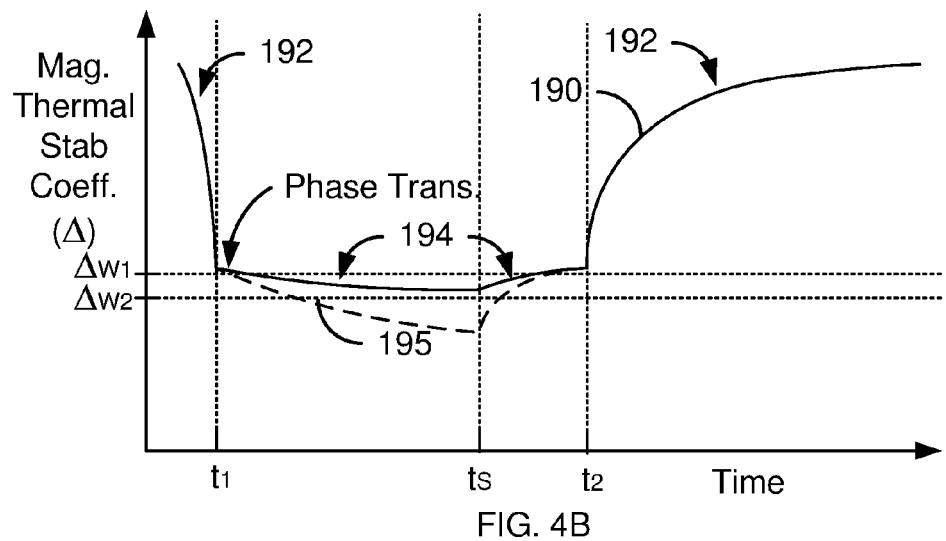

For example, FIGS. 4A and 4B depict the magnetic thermal stability coefficient versus temperature and the magnetic thermal stability coefficient versus time during switching respectively, for an exemplary embodiment of the magnetic device. Although particular curves are shown, the graphs in FIGS. 4A and 4B are for explanatory purposes only and are not meant to depict actual data unless expressly noted. Referring to FIGS. 2-4B, FIG. 4A includes a curve 180 depicting the magnetic thermal stability coefficient versus temperature for one embodiment of the free layer 130 having a multi-phase thermal stability coefficient and a dashed curve 185 depicts the magnetic thermal stability coefficient for another embodiment of the free layer 100 in which the magnetic thermal stability coefficient has a single phase. As can be seen in FIG. 4A, the magnetic thermal stability coefficient 185 smoothly goes to zero, with an increasingly negative slope. At temperature $T_1$, the conventional magnetic thermal stability coefficient 185 goes to zero and remains zero above $T_1$. Thus, the magnetic thermal stability coefficient 185 has a single phase below the critical temperature, $T_1$.

The magnetic thermal stability coefficient 180 includes two phases 182 and 184. The magnetic thermal stability coefficient 180 goes to zero at $T_2$ and may remain zero above $T_2$. Thus, $T_2$ may be considered the critical temperature for the magnetic thermal stability coefficient 180. This temperature may also be the Curie temperature. The magnetic thermal stability coefficient 180 is greater than zero below $T_2$ and has a phase transition at $T_1$. The first phase 182 is for temperatures below $T_1$, while the second phase 184 is for temperatures between $T_1$ and $T_2$. At the transition between the phases 182 and 184, the slope of the magnetic thermal stability coefficient 180 is discontinuous. The slope of the first phase 182 and the slope of the second phase 184 differ at the transition temperature $T_1$. Stated differently, the slope of the magnetic thermal stability coefficient 180 for the first phase 182 just below the temperature $T_1$ is different from the slope of the magnetic thermal stability coefficient 180 for the second phase 184 just above the temperature $T_1$. In other words, the magnetic thermal stability coefficient 180 has a sharp (phase) transition at $T_1$. Below $T_1$, the first phase 182 of the magnetic thermal stability coefficient 180 may change more rapidly. Above $T_1$, the second phase 184 of the magnetic thermal stability coefficient 180 may change more slowly. Thus, the slope of the first phase 182 is generally more negative than the slope of the second phase 184. In some embodiments, this corresponds to: $|\Delta_{T1} - \Delta_0 \Delta /(T_1 - T_0) > \Delta \Delta_{T2} - \Delta_{T1} \Delta /(T_2 - T_1)$. Because the second phase 184 of the magnetic thermal stability coefficient 180 changes more slowly than the first phase, the difference between $T_1$ and $T_2$ may be significant. In some embodiments, $T_2$ is at least one hundred degrees Celsius higher than $T_1$. For example, $T_1$ may be approximately one hundred fifty degrees Celsius and not more than two hundred degrees Celsius. In such an embodiment, $T_2$ may be two hundred fifty degrees Celsius or greater. In some such embodiments, $T_2$ may be as high as eight hundred degrees Celsius.

As can be seen in FIG. 4A, the magnetic thermal stability coefficients 180 and 185 are both above a minimum desired thermal stability coefficient for standby, $\Delta_s$, as long as the temperature does not exceed $T_s$. $T_s$ is the maximum temperature at which the free layer 130 is expected to be in standby (quiescent). In some embodiments, $T_s$ is not more than eighty-five degrees Celsius. The minimum desired magnetic thermal stability coefficient or standby ($\Delta_s$) is described above and may be eighty in some embodiments. Thus, the free layer 130 is sufficiently stable for the magnetic junction 100 to be used in STT-RAM.

As discussed above, the magnetic thermal stability coefficient is reduced during writing. This reduces the adherence of the magnetic moment of the free layer 130 to a specific direction. As a result, writing may be accomplished for either curve 180 or 185 faster and/or at a lower write current. If the free layer corresponding to the curves 180 and/or 185 may be written for magnetic thermal stability coefficients greater than zero (e.g. not less than $\Delta_{W2}$ and not more than $\Delta_{W1}$). For example, $\Delta_{W1}$ may be less than forty. In some embodiments, $\Delta_{W1}$ is not more than twenty-five. $\Delta_{W2}$ may be greater than or equal to twenty. Thus, the desired magnetic thermal stability coefficient range during writing may be relatively small. For the single phase magnetic thermal stability coefficient 185, this corresponds to a very small temperature range. Although the smart thermal barrier 160 may be capable of maintaining the magnetic thermal stability coefficient 185 within this range, to do so may be challenging. In contrast, because the magnitude of the slope of the multi-phase magnetic thermal stability coefficient 180 is smaller, the temperature range, $T_{W1}$ to $T_{W2}$, at which the magnetic thermal stability coefficient remains within the desired values is larger. The transition temperature range of the smart thermal barrier 160 is less than $T_{W1}$. Because the smart thermal barrier 160 has a large thermal conductivity in the desired range of temperatures for writing and because the desired temperature range is larger, the smart thermal barrier 160 may be better able to maintain the magnetic thermal stability coefficient 180 of the free layer 130 within the $\Delta_{W1}$ and $\Delta_{W2}$.

FIG. 4B includes a curve 190 depicting the magnetic thermal stability coefficient for the magnetic junction 100 in combination with the smart thermal barrier 160 versus time during a write operation. For comparison, the dashed line 195 indicates the behavior of the magnetic junction 100 during a thermally assisted write operation in the absence of the smart thermal barrier 160. The write current pulse or other heating mechanism is assumed to be switched off at time $t_s$. Below the transition temperature range of the smart thermal barrier, both curves 190 and 195 follow substantially the same curve. Without the smart thermal barrier 160, the free 130 layer continues to increase in temperature until $t_s$. As a result, the magnetic thermal stability coefficient 195 drops below the desired value of $\Delta_{W2}$. Although the magnetic junction 100 is less likely to switch back than if the magnetic thermal stability coefficient 195 reached zero, write errors may still occur.

In contrast, the curve 190 indicates the magnetic thermal stability coefficient of the free layer 130 during writing in the presence of the smart thermal barrier 160. As heat is applied, either externally or via a write current, the magnetic thermal stability coefficient 190 decreases and passes from the first phase 192 to the second phase 194. The free layer 130 reaches the transition temperature, $T_1$, at time $t_1$. The magnetic thermal stability coefficient 190 remains in the second phase 194. However, because of the presence of the smart thermal barrier, further increases in temperature of the free layer 130 are reduced or eliminated. Consequently, the magnetic thermal stability coefficient remains within the relatively small range of $\Delta_{W1}$ and $\Delta_{W2}$. At time $t_s$, the write current or heater power is turned off. The free layer 130 has been written by time $t_s$. In other embodiments, heating may be terminated at a different time than the write current. However, these times are generally desired to be very close, for example within a few hundred nanoseconds. During writing, between times $t_1$ and $t_s$, the magnetic thermal stability coefficient has remained at least $\Delta_{W2}$ and not more than $\Delta_{W1}$. In some embodiments, $\Delta_{W2}$ is at least twenty and $\Delta_{W1}$ is not more than forty. In some such embodiments, $\Delta_{W2}$ is at least twenty and $\Delta_{W1}$ is not more than twenty-five. After time $t_s$, the free layer 130 begins to cool. At time $t_2$, the free layer 130 has cooled sufficiently to transition back to the first phase 192. As can be seen in FIGS. 4A and 4B, the first phase 182/192 of the magnetic thermal stability coefficient 180/190 changes more rapidly with temperature, and thus time, than the second phase 184/194. Thus, the smart thermal barrier 160 needs to carry away less heat to maintain the free layer temperature and magnetic thermal stability coefficient within the desired ranges ($T_{W1}$ and $T_{W2}$, $\Delta_{W1}$ and $\Delta_{W2}$). Because the magnetic thermal stability coefficient 180/190 is more easily maintained in the desired range, the free layer magnetic moment is more easily written and likely to remain stable after being written.

The multi-phase nature of the magnetic thermal stability coefficient of the free layer 130 may be achieved by configuring the free layer 130. For example, the perpendicular magnetic anisotropy of the free layer 130 may be engineered to have multiple dependencies. In some embodiments, the free layer 130 may be a multilayer. One subset of sublayer(s) in the multilayer may have a perpendicular anisotropy that is insensitive or considerably less sensitive to temperature. For example, one or more of the sublayers may have a perpendicular anisotropy that arises primarily from a bulk interaction. This subset has a perpendicular anisotropy that is generally relatively insensitive to temperature and may correspond to at least the second phase of the magnetic thermal stability coefficient. Another subset of sublayer(s) may have a perpendicular anisotropy that is due primarily to an interface-induced anisotropy. Such a magnetic anisotropy is generally more sensitive to temperature. Consequently, the magnetic thermal stability coefficient may also be more sensitive to temperature. The magnetic layer having a lower temperature dependence for the magnetic thermal stability coefficient may be configured in a variety of ways. For example, the lower temperature dependence magnetic layer may include a $Co_aFe_bB_c/W/Fe/W/Co_dFe_eB_f$ multilayer. In such an embodiment, $a+b+c=1$, $d+e+f=1$, at least one of a and b is nonzero and at least one of d and e is nonzero. In some embodiments, additional repeats of CoFeB layers interleaved with and sandwiching W/Fe/W trilayers may be used. Similarly, at least one of d and e is nonzero. As a result, the lower temperature dependence layer is magnetic. In other embodiments, the lower temperature dependence magnetic layer may include a $Fe/Co_hFe_iB_j/W/Fe/W/Co_kFe_mB_n$ multilayer. In such an embodiment, $h+i+j=1$ and $k+m+n=1$. Further, at least one of h and i and at least one of k and m are nonzero. Thus, the lower temperature dependence layer is magnetic. Further, additional repeats of multilayers interleaved with and sandwiching W/Fe/W trilayers may be employed. The lower temperature dependence magnetic layer may also include a $Co_oFe_p/Co_qFe_rB_s/W/Fe/W/Co_tFe_uB_v$ multilayer, where $o+p=1$, $q+r+s=1$, and $t+u+v=1$. At least one of q and r and at least one of t and u are nonzero. Again, additional repeats of the magnetic layers separated by the W/Fe/W trilayer may also be used. Some combination of the above multilayers may also be used. In some embodiments, the lower temperature dependence magnetic layer is at least five and not more than twenty Angstroms thick. This subset of sublayer(s) form at least the second phase of the magnetic thermal stability coefficient. Other subset(s) of sublayer(s) may correspond to other phase(s) of the magnetic thermal stability coefficient for the free layer 130 having different temperature sensitivities. For example, the free layer 130 may include a first layer having an interface induced perpendicular anisotropy and a second layer having a bulk perpendicular magnetic anisotropy. These layers may be magnetically coupled through a coupling layer. Such a free layer 130 has at least two phases for the magnetic thermal stability coefficient 160/180 as discussed above.

In another embodiment, the free layer 130 may include multiple sublattices. One sublattice may correspond to the second phase and a magnetic thermal stability coefficient that is less sensitive to temperature. This sublattice may also have a bulk anisotropy that gives rise to the magnetic thermal stability coefficient. Another sublattice may correspond to the first phase and a magnetic thermal stability coefficient that is more sensitive to temperature. This sublattice may have an interfacial perpendicular anisotropy. Additional sublattice(s) may correspond to other phases having different temperature sensitivities of the magnetic thermal stability coefficient to temperature. For example, the free layer 130 may include an alloy having a first sublattice having a perpendicular magnetic anisotropy with a strong temperature dependence and a second sublattice having a perpendicular magnetic anisotropy with a weaker temperature dependence. Such a free layer 130 has at least two phases for the magnetic thermal stability coefficient.

The magnetic layer having a higher temperature dependence for the magnetic thermal stability coefficient may be configured in a variety of ways. The higher temperature dependent magnetic layer may include a $[Co_aT_b/Pd]_i$ bilayer, where $a+b=1$, a is greater than zero and i is at least one (at least one repeat) and T is a nonmagnetic metal. Similarly, a $Co_aT_bPd_c$ alloy in which $a+b+c=1$, a is greater than zero and T is a nonmagnetic metal may be used. A $[Fe_cX_d/Pd]_j$ bilayer in which $c+d=1$, j is at least one, c is greater than zero and X is a nonmagnetic metal may be used. The higher temperature dependent magnetic layer may include $Fe_cX_dPd_e$ alloy layer(s) in which $c+d+e=1$, c is greater than zero an X is a nonmagnetic metal. The higher temperature dependent magnetic layer may include a $[Co_eX_f/Pt]_k$ bilayer in which $e+f=1$, e is greater than zero, k is at least one and X is a nonmagnetic metal. $Co_eX_fPt_j$ alloy layer(s) in which $e+f+j=1$, e is greater than zero and X is a nonmagnetic metal may be used. The magnetic layer 230 may include $[Fe_gZ_h/Pt]_m$ bilayer in which $g+h=1$, g is greater than zero, m is at least one and Z is a nonmagnetic metal. $Fe_gZ_hPt_i$ alloy layer(s) in which $g+h=1$, g is greater than zero and Z is a nonmagnetic metal may be used. The higher temperature dependent magnetic layer may include one or more of a $[Co/Ni]_n$ bilayer where n is at least one, MnAl, MnGa, MnIn, MnGe, and $RE_oQ_p$ where RE is a rare earth and Q is selected from Fe, Co and Ni. Where not specified, various stoichiometries that result in the desired properties may be used. The higher temperature dependent magnetic layer may be at least ten Angstroms and not more than one hundred Angstroms thick.

The free layer 130 may also include a coupling layer between the high and low temperature dependent magnetic layers. Such a coupling layer may include at least one ferromagnetic material and at least one nonmagnetic material. The ferromagnetic material(s) are selected from Fe, Co, Ni, FeCo, FeNi, and FeCoNi. The nonmagnetic material may be selected from W, Ta, V, Ge, Mn, Zr, Cu, Ga, Li, Mo, Re, Rh, Se and Ti. For example, the coupling layer may include FeW at the desired stoichiometry. The coupling layer may be at least four Angstroms and not more than twenty Angstroms thick. The free layer 130 may also include enhancement layer(s) at the interface(s) of the free layer 130 with the nonmagnetic spacer layer(s) 120 and/or 140.

The free layer 130 may also have a gradient in the magnetic ordering temperature separate from or in addition to the presence of the multi-phase magnetic thermal stability coefficient. Stated differently, the free layer 130 may have a magnetic ordering temperature that spatially varies. This gradient in magnetic ordering temperature may also improve reliability of a write operation. In some embodiments, the magnetic ordering temperature varies in the direction of the write current. In some embodiments, the gradient in the magnetic ordering temperature is perpendicular to plane. In such embodiments, the magnetic ordering temperature is substantially constant in a direction parallel to the interfaces between the free layer 130 and another layer. Because of this gradient, some portions of the free layer may be magnetically ordered (e.g. ferromagnetic) at a particular temperature while others having a lower magnetic ordering temperature may be disordered (e.g. paramagnetic or superparamagnetic). The gradient in the magnetic ordering temperature may be configured such that portion(s) of the free layer 130 closer to the reference layer(s) 110 and/or 150 have magnetic ordering temperature(s) higher than a magnetic ordering temperature of a portion of the free layer 130 further from the reference layer(s) 110 and/or 150. In some embodiments, the gradient in the magnetic ordering temperature is such that the magnetic ordering temperature of the free layer 130 monotonically decreases with increasing distance from the reference layer(s) 110 and/or 150. Portions of the free layer 130 closer to the reference layer(s) 110 and/or 150 become magnetically ordered at higher temperatures than portion(s) of the free layer 130 further from the reference layer(s) 110 and/or 150. In other words, portions of the free layer 130 closer to the reference layer(s) 110 and/or 150 may undergo transition(s) between paramagnetic and ferromagnetic (e.g. magnetically disordered and magnetically ordered) at higher temperatures than portions of the free layer 130 further from the reference layer(s) 110 and/or 150. In some embodiments, the free layer 130 may be configured such that portion(s) of the free layer 130 remains magnetically ordered throughout operation and the gradient in the magnetic ordering temperature is such that the magnetic ordering temperature decreases with increasing distance from the magnetically ordered portion(s) of the free layer 130. This decrease in magnetic ordering temperature with increasing distance from the reference layer(s) 110 and/or 150 and/or magnetically ordered region of the free layer may be linear, piece-wise linear, step-wise, follow a curve or occur in another fashion. A free layer 130 having such a configuration may be more likely to remain stable after being written. As a result, reliability of the magnetic junction 100 may be improved.

The variation of magnetic ordering temperature within the free layer 130 may be controlled by configuring various parameters of the free layer 130. For example, a gradient in the Curie temperature of the free layer 130 may result in a gradient in the magnetic ordering temperature. The free layer may be configured such that the Curie temperature decreases with increasing distance from the reference layer. In some embodiments, this is achieved by varying the composition of the free layer 130. In other embodiments, a multilayer including magnetic layers having different Curie temperatures may be used. The critical temperature of a magnetic exchange coupling between portions of the free layer 130 and/or between the free layer 130 and another layer may be varied. Portions of the free layer having a higher exchange coupling may become magnetically ordered at higher temperatures than those with a weaker exchange coupling. A gradient in the saturation magnetization ($M_s$) of the free layer 130 may also cause a gradient in the magnetic ordering temperature of the free layer. An anisotropy ($H_k$) gradient, particularly a perpendicular anisotropy gradient, may also affect the magnetic ordering temperature of portions of the free layer 130. In general, a higher saturation magnetization and/or a higher anisotropy corresponds to a higher magnetic ordering temperature. A gradient in the product of the saturation magnetization and a thickness of a corresponding portion of the free layer 130 ($M_s$ multiplied by local thickness such as sublayer thickness=$M_s$*t) may result in a gradient in the magnetic ordering temperature of the free layer 130. Similarly, a gradient in a product of a perpendicular anisotropy field and thickness ($H_k$ multiplied by local thickness such as sublayer thickness=$H_k$*t) may result in a gradient in the magnetic ordering temperature of the free layer 130. The exchange coupling may also have a gradient over a particular temperature range and/or stray magnetic field may have a gradient that results in a gradient in the magnetic ordering temperature of the free layer 130. Any of the above parameters, separately or in any combination, may be used to configure the free layer 130 to have a gradient in the free layer magnetic ordering temperature.

Configuration of the above parameters resulting in a desired gradient in the magnetic ordering temperature of the free layer 130 may be achieved by controlling the structure of the free 130. For example, the free layer 130 may include CoFeB layer(s) closest to the reference layer(s) 110 and/or 150, a coupling layer and a thermal layer having the gradient in magnetic ordering temperature discussed above. The CoFeB layer(s) enhance the tunneling magnetoresistance (TMR) and/or spin polarized current for spin transfer and remain magnetically stable throughout operation of the free layer 130. The coupling layer may be used to structurally decouple the CoFeB layer from the thermal layer while still providing magnetic coupling between CoFeB and the thermal layer. The CoFeB layer 202 is generally body-centered cubic (BCC). The thermal layer may have another crystal structure, including but not limited to hexagonal close-packed (HCP). The coupling layer may be a FeTa or FeW layer. The thermal layer has a gradient in magnetic ordering temperature such that the magnetic ordering temperature decreases with increasing distance from the reference layer(s) 110 and/or 150. The thermal layer might include Co containing magnetic layers interleaved with and sandwiching nonmagnetic layers. The magnetic layers may include $Co_mFe_{1-m}$ and each of the nonmagnetic layer(s) may include $Pd_nPt_{1-n}$, where m is not less than zero and not greater than one and where n is not less than zero and not greater than one. In such an embodiment, m and/or n may vary within a layer and/or between layers to provide the desired magnetic ordering temperature gradient. As a result, the magnetic ordering temperatures of the magnetic layers decrease with increasing distance from the reference layer(s). In another embodiment each of the magnetic layers may include $Co_pFe_qZ_{1-p-q}$ and each of the nonmagnetic layer(s) may include W, where p is not less than zero and not greater than one and where q is not less than zero and not greater than one. In such an embodiment, p and/or q may vary within a layer and/or between layers to provide the desired magnetic ordering temperature gradient. In another embodiment, each of the magnetic layers may include $Co_rFe_sZ_{1-r-s}$ and each of the nonmagnetic layer(s) may include Ta, where r is not less than zero and not greater than one and where s is not less than zero and not greater than one. In such an embodiment, r and/or s may vary within a layer and/or between layers to provide the desired magnetic ordering temperature gradient. In another embodiment each of the magnetic layers may include $Co_tFe_uZ_{1-t-u}$ and each of the nonmagnetic layer(s) may include $Fe_vTa_{1-v}$, where t is not less than zero and not greater than one, u is not less than zero and not greater than one, v is not less than zero and not greater than one and Z includes at least one of B, Ge, Al and Ga. In such an embodiment, t, u and/or v may vary within a layer and/or between layers to provide the desired magnetic ordering temperature gradient. In another embodiment, each of the magnetic layers may include $Co_wFe_xB_{1-w-x}$ and each of the nonmagnetic layers may include MgO, where w is not less than zero and not greater than one and where x is not less than zero and not greater than one. In such an embodiment, w and/or x may vary within a layer and/or between layers to provide the desired magnetic ordering temperature gradient. In another embodiment, some combination of the above may be used. Alternatively, the thermal layer may be a single magnetic alloy layer that has a varying magnetic ordering temperature. The concentration of the magnetic element(s) and/or the constituents in the thermal layer may be varied. For example, the thermal layer may include a $Co_xFe_yPd_zPt_{1-x-y-z}$ alloy, wherein x, y and z are each not less than zero and not greater than one and wherein at least one of x and y is greater than zero. In such a case, x, y and/or z may be varied such that the magnetic ordering temperature of the local region of the thermal layer decreases with increasing distance from the reference layer(s) 110 and/or 150.

The magnetic device including the magnetic junction 100 and smart thermal barrier 160 may have improved performance. The free layer 130 may be switched using spin transfer torque. Thus, a more localized physical phenomenon may be used to write to the free layer 130. The thermal properties of the free layer 130 and magnetic junction 100 may also be configured. In particular, the magnetic moment of the free layer 130 may be more easily and reliably switched. Because higher temperature switching may be used, the write current may be reduced and/or switching may be performed more rapidly. This switching may occur at a magnetic thermal stability coefficient Δ that is greater than zero at least in part because of the multi-phase nature of the magnetic thermal stability constant. The values of the magnetic thermal stability coefficient may be better controlled using the smart thermal barrier. As a result, the free layer magnetic moment is more stable after switching, during cooling of the free layer 130. A gradient in magnetic ordering temperature of the free layer may further improve reliability of switching. Consequently, reliability of programming the free layer 130 may be enhanced. Thus, the magnetic junction 100 may have improved performance.

Figure 5:
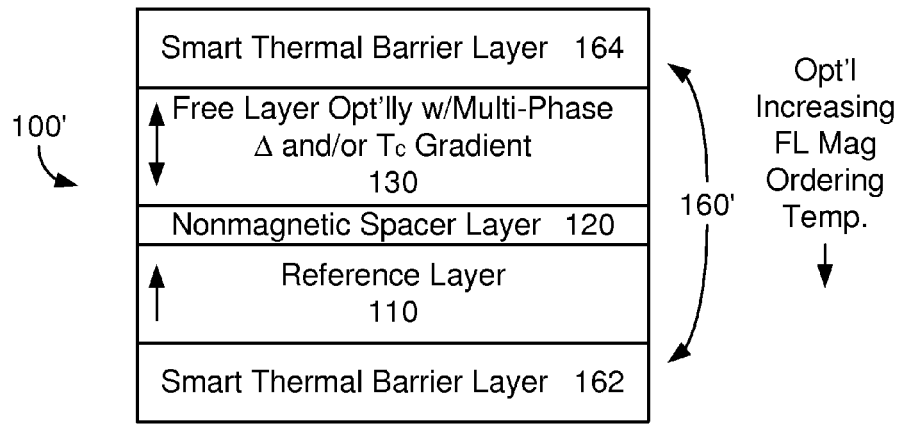
FIG. 5 depicts another exemplary embodiment of a magnetic device usable in a magnetic memory and including a magnetic junction programmable using spin transfer torque and smart thermal barrier(s).

FIG. 5 depicts another exemplary embodiment of another magnetic device including a magnetic junction 100' and a smart thermal barrier 160'. For clarity, FIG. 5 is not to scale. The magnetic device may be used in a device such as a STT-MRAM and, therefore, in a variety of electronic devices. The magnetic junction 100' is analogous to the magnetic junction 100 described previously. Consequently, analogous components are labeled similarly. Thus, the magnetic junction 100' includes a reference layer 110, a nonmagnetic spacer layer 120, and a free layer 130 that are analogous to the layers 110, 120 and 130, respectively, for the magnetic junction 100. The layers 106, 140, 150 and 109 as well as other surrounding layers have been omitted. In the embodiment shown in FIG. 5, therefore, the magnetic junction 100' is a single magnetic junction including only one nonmagnetic spacer layer 120. Although the free layer 130 is shown on the reference layer 110 in the magnetic junction 100', in other embodiments, the order of the layers 110, 120 and 130 may be reversed. Alternatively, the single magnetic junction 100' could include layers 130, 140 and 150. In some embodiments, the free layer 130 may have a multi-phase magnetic thermal stability coefficient and/or a gradient in magnetic ordering temperature as discussed above.

The smart thermal barrier 160' is shown as including smart thermal barrier layers 162 and 164. In various embodiment, the layer 162 or 164 might be omitted. Further, although not shown, electrical contacts may be between the smart thermal barrier layer(s) 162 and 164 and the magnetic junction 100'. In this embodiment, therefore, the smart thermal barrier 160' includes a smart thermal seed layer 162 and/or a smart thermal capping layer 164 residing below and/or on the magnetic junction 100'.

The free layer 130 is programmed and read in an analogous manner to the free layer 130 described above. Thus, the magnetic junction 100' may remain stable during reading and may share the benefits of the magnetic junction 100. The free layer 130 may be switched using spin transfer torque. Thus, a more localized physical phenomenon may be used to write to the free layer 130. In particular, the magnetic moment of the free layer 130 may be more rapidly, easily and reliably switched using thermal assistance. The write current may also be reduced. As described above, this switching may occur at a magnetic thermal stability coefficient Δ that is greater than zero and within a desired range. The free layer magnetic moment is more stable after switching, during cooling of the free layer 130. Consequently, reliability of programming the free layer 130 may be enhanced. Thus, the magnetic junction 100' may have improved performance.

Figure 6:
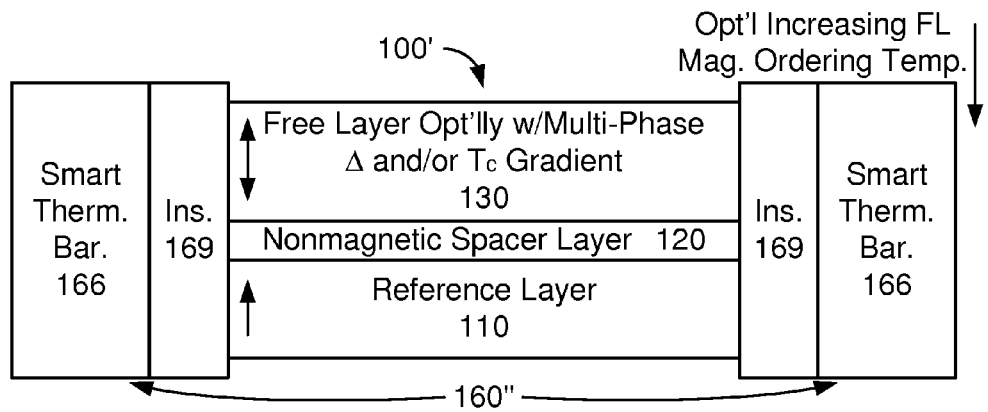
FIG. 6 depicts another exemplary embodiment of a magnetic device usable in a magnetic memory and including a magnetic junction programmable using spin transfer torque and smart thermal barrier(s).

FIG. 6 depicts another exemplary embodiment of another magnetic device including a magnetic junction 100' and a smart thermal barrier 160". For clarity, FIG. 6 is not to scale. The magnetic device may be used in a device such as a STT-RAM and, therefore, in a variety of electronic devices. The magnetic junction 100' is analogous to the magnetic junction 100 described previously. Consequently, analogous components are labeled similarly. Thus, the magnetic junction 100' includes a reference layer 110, a nonmagnetic spacer layer 120, and a free layer 130 that are analogous to the layers 110, 120 and 130, respectively, for the magnetic junction 100. The layers 106, 140, 150 and 109 as well as other surrounding layers have been omitted. In the embodiment shown in FIG. 6, therefore, the magnetic junction 100' is a single magnetic junction including only one nonmagnetic spacer layer 120. Although the free layer 130 is shown on the reference layer 110 in the magnetic junction 100', in other embodiments, the order of the layers 110, 120 and 130 may be reversed. Alternatively, the single magnetic junction 100' could include layers 130, 140 and 150. In some embodiments, the free layer 130 may have a multi-phase magnetic thermal stability coefficient and/or a gradient in magnetic ordering temperature as discussed above.

The smart thermal barrier 160" is shown as including smart thermal barrier refill structure 166. Also shown is insulator 169. The smart thermal barrier refill structure 166 surrounds the sidewalls of magnetic junction 100'. However, the insulator 169 electrically insulates the smart thermal barrier 166 from the magnetic junction 100'. As a result, the smart thermal barrier 160" does not short the magnetic junction 100'. For example, the smart thermal barrier 160" may be an insulator below the transition temperature range and a conductive metal above the transition temperature range. Without the insulator 169, the smart thermal barrier 160" might short the magnetic junction 100' at temperatures greater than the transition temperature range. However, in embodiments in which the smart thermal barrier 160" remains an insulator regardless of its thermal conductance, the insulator 169 may be omitted.

The free layer 130 is programmed and read in an analogous manner to the free layer 130 described above. Thus, the magnetic junction 100' may remain stable during reading and may share the benefits of the magnetic junction 100. The free layer 130 may be switched more rapidly, easily and reliably switched using thermally assisted spin transfer torque. The write current may also be reduced. This switching may occur at a magnetic thermal stability coefficient that is controlled to be within a desired range using the smart thermal barrier 160". The free layer magnetic moment is more stable after switching, during cooling of the free layer 130. Consequently, reliability of programming the free layer 130 may be enhanced. Thus, the magnetic junction 100' may have improved performance.

Figure 7:
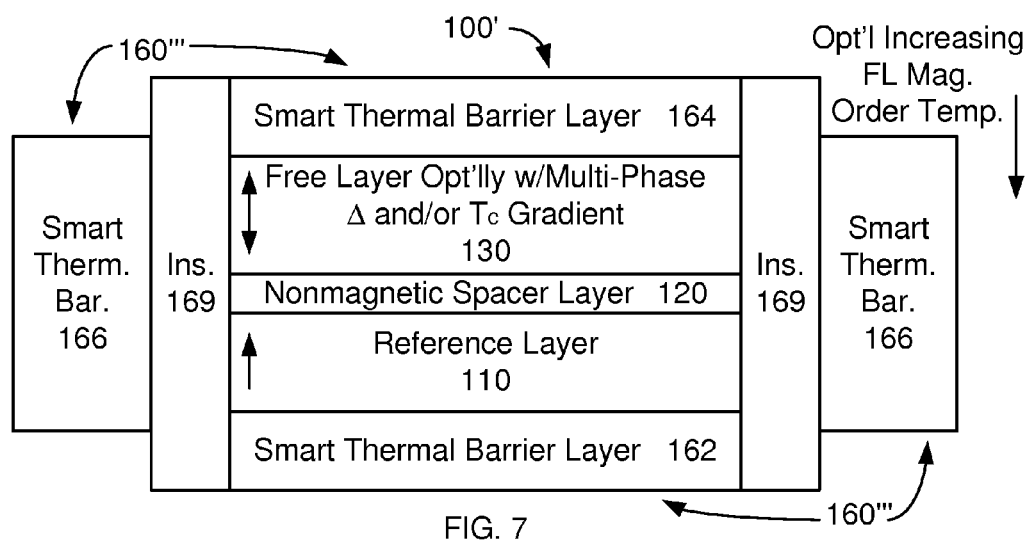
FIG. 7 depicts another exemplary embodiment of a magnetic device usable in a magnetic memory and including a magnetic junction programmable using spin transfer torque and smart thermal barrier(s).

FIG. 7 depicts another exemplary embodiment of another magnetic device including a magnetic junction 100' and a smart thermal barrier 160'". For clarity, FIG. 7 is not to scale. The magnetic device may be used in a device such as a STT-MRAM and, therefore, in a variety of electronic devices. The magnetic junction 100' is analogous to the magnetic junction 100 described previously. Consequently, analogous components are labeled similarly. Thus, the magnetic junction 100' includes a reference layer 110, a nonmagnetic spacer layer 120, and a free layer 130 that are analogous to the layers 110, 120 and 130, respectively, for the magnetic junction 100. The layers 106, 140, 150 and 109 as well as other surrounding layers have been omitted. In the embodiment shown in FIG. 7, therefore, the magnetic junction 100' is a single magnetic junction including only one nonmagnetic spacer layer 120. Although the free layer 130 is shown on the reference layer 110 in the magnetic junction 100', in other embodiments, the order of the layers 110, 120 and 130 may be reversed. Alternatively, the single magnetic junction 100' could include layers 130, 140 and 150. In some embodiments, the free layer 130 may have a multi-phase magnetic thermal stability coefficient and/or a gradient in magnetic ordering temperature as discussed above.

The smart thermal barrier 160'" is shown as including smart thermal barrier layer 162, smart thermal barrier layer 164 and smart thermal barrier refill structure 166. Also shown is insulator 169. In some embodiments, the layer 162 or 164 may be omitted. Although not shown, electrical contacts may be between the smart thermal barrier layer(s) 162 and 164 and the magnetic junction 100'. The smart thermal barrier refill structure 166 surrounds the sidewalls of magnetic junction 100'. However, the insulator 169 electrically insulates the smart thermal barrier 166 from the magnetic junction 100'. As a result, the smart thermal barrier 160'" does not short the magnetic junction 100'. For example, the smart thermal barrier 160'" may be an insulator below the transition temperature range and a conductive metal above the transition temperature range. Without the insulator 169, the smart thermal barrier 160'" might short the magnetic junction 100' at temperatures greater than the transition temperature range. However, in embodiments in which the smart thermal barrier 160'" remains an insulator regardless of its thermal conductance, the insulator 169 may be omitted.

The free layer 130 is programmed and read in an analogous manner to the free layer 130 described above. Thus, the magnetic junction 100' may remain stable during reading and may share the benefits of the magnetic junction 100. The free layer 130 may be switched more rapidly, easily and reliably using thermally assisted spin transfer torque. The write current may also be reduced. This switching may occur at a magnetic thermal stability coefficient that is controlled to be within a desired range using the smart thermal barrier 160'". The free layer magnetic moment is more stable after switching, during cooling of the free layer 130. Consequently, reliability of programming the free layer 130 may be enhanced. Thus, the magnetic junction 100' may have improved performance.

Figure 8:
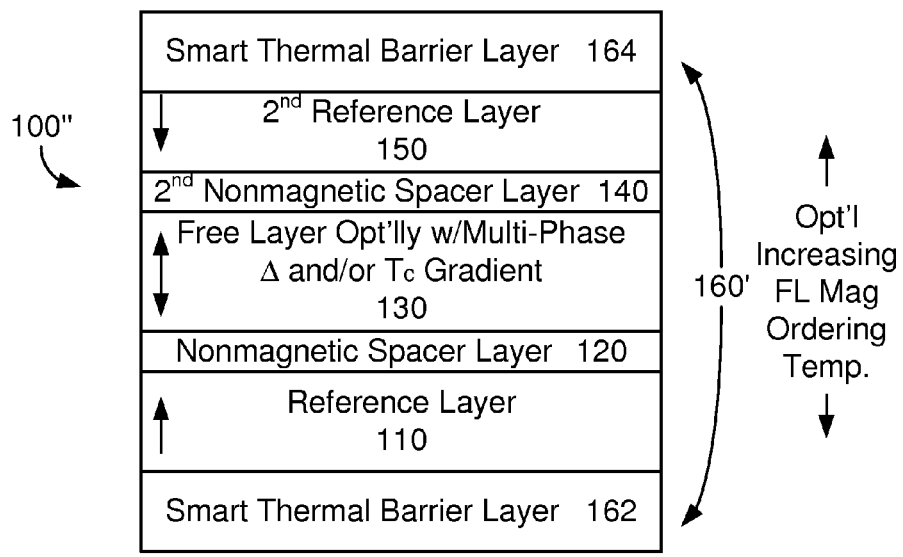
FIG. 8 depicts another exemplary embodiment of a magnetic device usable in a magnetic memory and including a magnetic junction programmable using spin transfer torque and smart thermal barrier(s).

FIG. 8 depicts another exemplary embodiment of another magnetic device including a magnetic junction 100" and a smart thermal barrier 160'. For clarity, FIG. 8 is not to scale. The magnetic junction 100" may be used in a device such as a STT-MRAM and, therefore, in a variety of electronic devices. The magnetic junction 100" is analogous to the magnetic junctions 100 and 100'. Consequently, analogous components are labeled similarly. Thus, the magnetic junction 100" includes a reference layer 110, a nonmagnetic spacer layer 120, a free layer 130, an additional nonmagnetic spacer layer 140 and a reference layer 150 that are analogous to the layers 110, 120, 130, 140 and 150 respectively, for the magnetic junctions 100 and 100'. Other layers and additional structures are omitted. In the embodiment shown in FIG. 8, therefore, the magnetic junction 100" is a dual magnetic junction. The magnetic moments of the reference layers 110 and 150 are shown in the dual state. This state may be desired for writing. In other embodiments, the magnetic moments of the reference layer 110 and 150 may be parallel (antidual state), which may be more desirable for read operations. In other embodiments, the magnetic moments of the layers 110 and 150 may be switched between the dual and antidual states depending upon the operation to be performed. In some embodiments, the free layer 130 may have a multi-phase magnetic thermal stability coefficient and/or a gradient in magnetic ordering temperature as discussed above.

The smart thermal barrier 160' is shown as including smart thermal barrier layers 162 and 164. In various embodiment, the layer 162 or 164 might be omitted. Further, although not shown, electrical contacts may be between the smart thermal barrier layer(s) 162 and 164 and the magnetic junction 100".

In this embodiment, therefore, the smart thermal barrier 160' includes a smart thermal seed layer 162 and/or a smart thermal capping layer 164 residing below and/or on the magnetic junction 100".

The free layer 130 is programmed and read in an analogous manner to the free layer 130 described above. Thus, the magnetic junction 100" may remain stable during reading and may share the benefits of the magnetic junctions 100 and/or 100'. The free layer 130 may be switched using spin transfer torque. Thus, a more localized physical phenomenon may be used to write to the free layer 130. In particular, the magnetic moment of the free layer 130 may be more rapidly, easily and reliably switched using thermal assistance. The write current may also be reduced. As described above, this switching may occur at a magnetic thermal stability coefficient that is greater than zero and within a desired range. The free layer magnetic moment is more stable after switching, during cooling of the free layer 130. Further, programming and/or reading may be enhanced by the presence of two reference layers 110 and 150. Consequently, reliability of programming the free layer 130 may be enhanced. Thus, the magnetic junction 100' may have improved performance.

Figure 9:
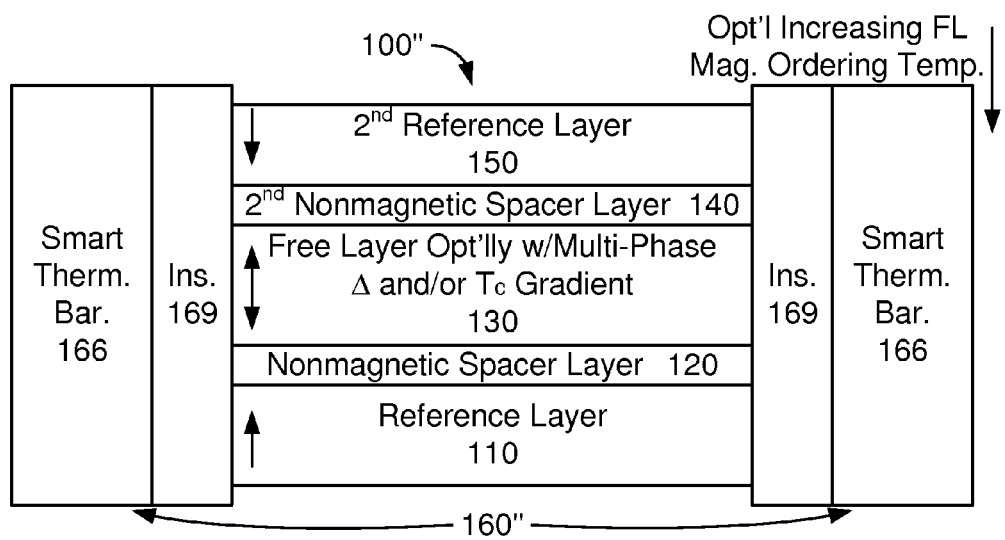
FIG. 9 depicts another exemplary embodiment of a magnetic device usable in a magnetic memory and including a magnetic junction programmable using spin transfer torque and smart thermal barrier(s).

FIG. 9 depicts another exemplary embodiment of another magnetic device including a magnetic junction 100" and a smart thermal barrier 160". For clarity, FIG. 9 is not to scale. The magnetic device may be used in a device such as a STT-MRAM and, therefore, in a variety of electronic devices. The magnetic junction 100" is analogous to the magnetic junctions 100 and 100'. Consequently, analogous components are labeled similarly. Thus, the magnetic junction 100" includes a reference layer 110, a nonmagnetic spacer layer 120, a free layer 130, an additional nonmagnetic spacer 140 and a reference layer 150 that are analogous to the layers 110, 120, 130, 140 and 150 respectively, for the magnetic junctions 100 and 100'. Other layers and additional structures are omitted. In the embodiment shown in FIG. 9, therefore, the magnetic junction 100" is a dual magnetic junction. The magnetic moments of the reference layers 110 and 150 are shown in the dual state. This state may be desired for writing. In other embodiments, the magnetic moments of the reference layer 110 and 150 may be parallel (antidual state), which may be more desirable for read operations. In other embodiments, the magnetic moments of the layers 110 and 150 may be switched between the dual and antidual states depending upon the operation to be performed. In some embodiments, the free layer 130 may have a multi-phase magnetic thermal stability coefficient and/or a gradient in magnetic ordering temperature as discussed above.

The smart thermal barrier 160" is shown as including smart thermal barrier refill structure 166. Also shown is insulator 169. The smart thermal barrier refill structure 166 surrounds the sidewalls of magnetic junction 100'. However, the insulator 169 electrically insulates the smart thermal barrier 166 from the magnetic junction 100'. As a result, the smart thermal barrier 160" does not short the magnetic junction 100'. For example, the smart thermal barrier 160" may be an insulator below the transition temperature range and a conductive metal above the transition temperature range. Without the insulator 169, the smart thermal barrier 160" might short the magnetic junction 100' at temperatures greater than the transition temperature range. However, in embodiments in which the smart thermal barrier 160" remains an insulator regardless of its thermal conductance, the insulator 169 may be omitted.

The free layer 130 is programmed and read in an analogous manner to the free layer 130 described above. Thus, the magnetic junction 100" may remain stable during reading and may share the benefits of the magnetic junctions 100 and/or 100'. The free layer 130 may be switched using spin transfer torque. Thus, a more localized physical phenomenon may be used to write to the free layer 130. In particular, the magnetic moment of the free layer 130 may be more rapidly, easily and reliably switched using thermal assistance. The write current may also be reduced. As described above, this switching may occur at a magnetic thermal stability coefficient that is greater than zero and within a desired range. The free layer magnetic moment is more stable after switching, during cooling of the free layer 130. Further, programming and/or reading may be enhanced by the presence of two reference layers 110 and 150. Consequently, reliability of programming the free layer 130 may be enhanced. Thus, the magnetic junction 100' may have improved performance.

Figure 10:
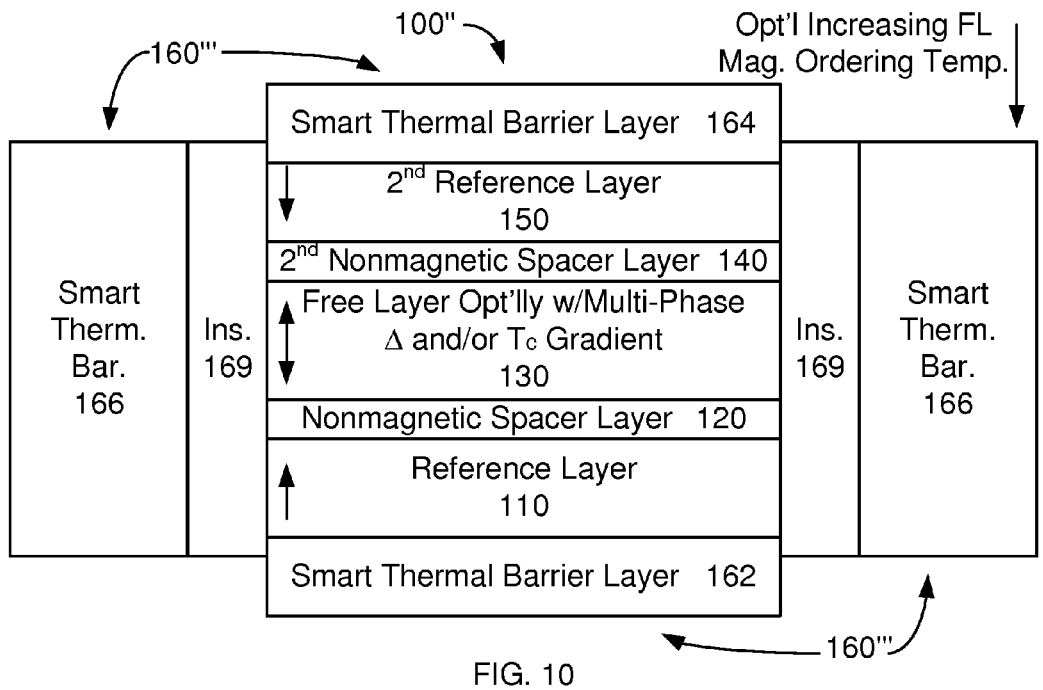
FIG. 10 depicts another exemplary embodiment of a magnetic device usable in a magnetic memory and including a magnetic junction programmable using spin transfer torque and smart thermal barrier(s).

FIG. 10 depicts another exemplary embodiment of another magnetic device including a magnetic junction 100' and a smart thermal barrier 160'". For clarity, FIG. 10 is not to scale. The magnetic device may be used in a device such as a STT-MRAM and, therefore, in a variety of electronic devices. The magnetic junction 100" is analogous to the magnetic junctions 100 and 100'. Consequently, analogous components are labeled similarly. Thus, the magnetic junction 100" includes a reference layer 110, a nonmagnetic spacer layer 120, a free layer 130, an additional nonmagnetic spacer 140 and a reference layer 150 that are analogous to the layers 110, 120, 130, 140 and 150 respectively, for the magnetic junctions 100 and 100'. Other layers and additional structures are omitted. In the embodiment shown in FIG. 10, therefore, the magnetic junction 100" is a dual magnetic junction. The magnetic moments of the reference layers 110 and 150 are shown in the dual state. This state may be desired for writing. In other embodiments, the magnetic moments of the reference layer 110 and 150 may be parallel (antidual state), which may be more desirable for read operations. In other embodiments, the magnetic moments of the layers 110 and 150 may be switched between the dual and antidual states depending upon the operation to be performed. In some embodiments, the free layer 130 may have a multi-phase magnetic thermal stability coefficient and/or a gradient in magnetic ordering temperature as discussed above.

The smart thermal barrier 160'" is shown as including smart thermal barrier layer 162, smart thermal barrier layer 164 and smart thermal barrier refill structure 166. Also shown is insulator 169. In some embodiments, the layer 162 or 164 may be omitted. Although not shown, electrical contacts may be between the smart thermal barrier layer(s) 162 and 164 and the magnetic junction 100'. The smart thermal barrier refill structure 166 surrounds the sidewalls of magnetic junction 100'. However, the insulator 169 electrically insulates the smart thermal barrier 166 from the magnetic junction 100'. As a result, the smart thermal barrier 160'" does not short the magnetic junction 100'. For example, the smart thermal barrier 160'" may be an insulator below the transition temperature range and a conductive metal above the transition temperature range. Without the insulator 169, the smart thermal barrier 160'" might short the magnetic junction 100' at temperatures greater than the transition temperature range. However, in embodiments in which the smart thermal barrier 160'" remains an insulator regardless of its thermal conductance, the insulator 169 may be omitted.

The free layer 130 is programmed and read in an analogous manner to the free layer 130 described above. Thus, the magnetic junction 100" may remain stable during reading and may share the benefits of the magnetic junctions 100 and/or 100'. The free layer 130 may be switched using spin transfer torque. Thus, a more localized physical phenomenon may be used to write to the free layer 130. In particular, the magnetic moment of the free layer 130 may be more rapidly, easily and reliably switched using thermal assistance. The write current may also be reduced. As described above, this switching may occur at a magnetic thermal stability coefficient that is greater than zero and within a desired range. The free layer magnetic moment is more stable after switching, during cooling of the free layer 130. Further, programming and/or reading may be enhanced by the presence of two reference layers 110 and 150. Consequently, reliability of programming the free layer 130 may be enhanced. Thus, the magnetic junction 100' may have improved performance.

Figure 11:
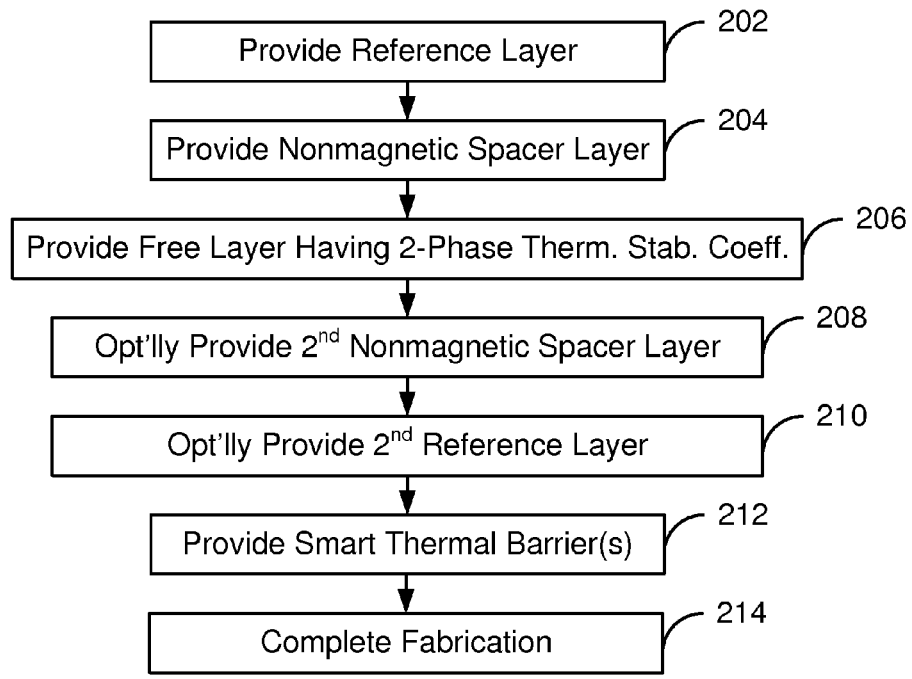
FIG. 11 is a flow chart depicting an exemplary embodiment of a method for providing a magnetic device usable in a magnetic memory and including a magnetic junction programmable using spin transfer torque and smart thermal barrier(s).

FIG. 11 depicts an exemplary embodiment of a method 200 for fabricating a magnetic device. For simplicity, some steps may be omitted or combined. The method 200 is described in the context of the magnetic junctions 100, 100' and 100" and smart thermal barriers 160, 160', 160" and 160'". However, the method 200 may be used on other magnetic junctions and/or other smart thermal barriers. Further, the method 200 may be incorporated into fabrication of magnetic memories. Thus the method 200 may be used in manufacturing a STT-MRAM or other magnetic memory.

The reference layer 110/110' that may be a SAF is provided, via step 202. Step 202 may include depositing the desired materials at the desired thickness of the reference layer 110. The nonmagnetic layer 120 is provided, via step 204. Step 204 may include depositing the desired nonmagnetic materials. In addition, the desired thickness of material may be deposited in step 204. The free layer 130 is provided, via step 206. Step 206 may thus include depositing the material(s) which result in a multi-phase magnetic thermal stability coefficient and/or a gradient in magnetic ordering temperature. Thus, multilayer(s) or alloy(s) with sublattices may be provided in step 206. The nonmagnetic layer 140 may optionally be provided, via step 208. The desired reference layer 150 may optionally be provided, via step 210. A smart thermal barrier 160, 160', 160" and/or 160'" may then be provided, via step 212. Portions of step 212 may be performed before steps 202 through 210 or be interleaved with fabrication of the magnetic junction 100/100'. Fabricating of the magnetic device may then be completed, via step 214. Consequently, the benefits of the magnetic junction(s) 100, 100' and/or 100" as well as the benefits of the smart thermal barrier(s) 160, 160', 160" and/or 160'" may be achieved.

Figures 12, 13, 14:
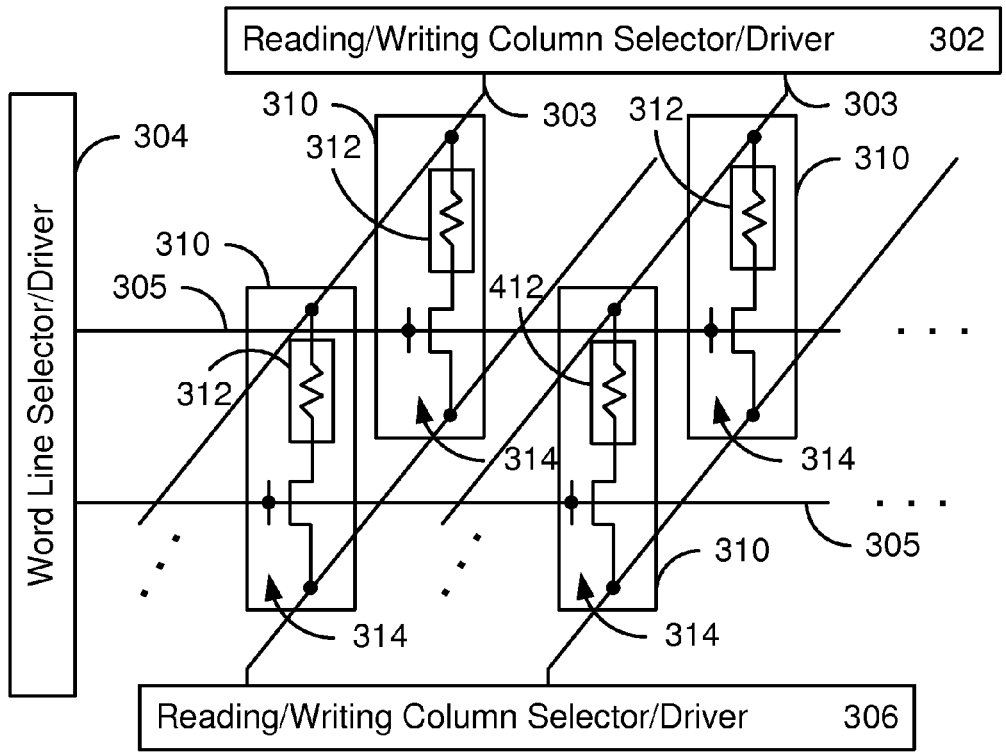
FIG. 12 depicts an exemplary embodiment of a memory utilizing magnetic devices in the memory element(s) of the storage cell(s).
FIG. 13 depicts an exemplary embodiment of a method for programming a magnetic device usable in a magnetic memory and including a magnetic junction programmable using spin transfer torque and smart thermal barrier(s).
FIG. 14 depicts another exemplary embodiment of a method for programming a magnetic device usable in a magnetic memory and including a magnetic junction programmable using spin transfer torque and smart thermal barrier(s).

FIG. 12 depicts an exemplary embodiment of a memory 300 that may use one or more of the magnetic devices including magnetic junctions 100, 100' and/or 100" and the smart thermal barriers 160, 160', 160" and/or 160'". The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic device 312 and at least one selection device 314. In some embodiments, the selection device 314 is a transistor. The magnetic devices 312 may include at least one of the magnetic junctions 100, 100' and/or and the smart thermal barrier(s) 160, 160', 160" and/or 160'". Although one magnetic device 312 is shown per cell 310, in other embodiments, another number of magnetic devices 312 may be provided per cell. Further, although not shown, in some embodiments, the memory 300 may include heaters and associated electronics or some other mechanism used to heat the magnetic devices 312. Elevated temperatures of the magnetic devices 312 during programming allow for operation as discussed above. As such, the magnetic memory 300 may enjoy the benefits described above.

FIG. 13 depicts an exemplary embodiment of a method 400 for programming a magnetic junction. For simplicity, some steps may be omitted or combined. The method 400 is described in the context of the magnetic devices including magnetic junctions 100, 100' and/or 100" as well as smart thermal barriers 160, 160', 160" and/or 160'". However, the method 400 may be used on other magnetic devices.

A write current is driven through the free layer at elevated temperatures, via step 402. This is performed at least for the free layer temperatures above the transition temperature range of the smart thermal barrier. Further, the temperatures for which current is driven through the magnetic junction correspond to magnetic thermal stability coefficients that are greater than zero and within a desired range. For example, the free layer magnetic thermal stability coefficient may be at least twenty and not more than forty for at least part of step 402. In some such embodiments, the magnetic thermal stability coefficient is not more than twenty-five. Note that step 402 does not indicate how the free layer is heated for step 402. The heating may be accomplished using the write current only. In such embodiments, the write current is terminated before the magnetic thermal stability coefficient reaches zero. In other embodiments, heating may also involve a separate heat source, such as a current driven through a heater. In such embodiments, both the write current and heater power are terminated before the magnetic thermal stability coefficient reaches zero.

Using the method 400, the magnetic junction 100, 100' and/or may be more reliably and easily written. Because the write current is driven through the magnetic junction 100, 100' and/or 100" at elevated temperatures and lower magnetic thermal stability coefficients, switching may be more rapidly achieved at lower temperatures. In addition, the write current is terminated while the magnetic thermal stability coefficient is nonzero and, because of the smart thermal barrier 160/160'/160"/160'", within a desired range. Switching is, therefore, more stable. Thus performance and reliability of the write operation may be improved.

FIG. 14 depicts an exemplary embodiment of a method 410 for programming a magnetic device. For simplicity, some steps may be omitted or combined. The method 410 is described in the context of the magnetic junctions 100, 100' and/or 100" and smart thermal barrier(s) 160, 160', 160" and/or 160'". However, the method 410 may be used on other magnetic devices.

The free layer is heated to temperature(s) corresponding to a desired temperature range, via step 412. This temperature range is greater than the transition temperature range of the smart thermal barrier 160, 160', 160" and/or 160'". In addition, the temperature may be for a phase of the magnetic thermal stability coefficient that has a reduced temperature dependence. Step 412 may be accomplished using a heater or by driving the write current through the magnetic junction in connection with controlling heating using the smart thermal barrier 160, 160', 160" and/or 160'".

A write current is driven through the free layer at elevated temperatures and terminated while the magnetic thermal stability coefficient is in the desired range, via step 414. For example, the write current may be terminated while the magnetic thermal stability coefficient is at least twenty.

Using the method 410, the magnetic junction 100, 100' and/or 100" may be more reliably and easily written. Thus performance and reliability of the write operation may be improved.

A method and system for providing a magnetic junction and an electronic device, such as one including a memory fabricated using the magnetic junction, has been described.

The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic device comprising:
   a magnetic junction including at least one reference layer, at least one nonmagnetic spacer layer, and a free layer, the at least one nonmagnetic spacer layer being between the free layer and the at least one reference layer, the free layer being switchable between a plurality of stable magnetic states when a write current is passed through the magnetic junction; and
   at least one smart thermal barrier thermally coupled with the magnetic junction, the at least one smart thermal barrier having a low heat conductance below a transition temperature range, and a high heat conductance above the transition temperature range.

2. The magnetic device of claim 1 wherein the low heat conductance corresponds to a high resistance and the high heat conductance corresponds to a low resistance, the low resistance being not more than one tenth of the high resistance.

3. The magnetic device of claim 2 wherein the low resistance is not more than one-hundredth of the high resistance.

4. The magnetic device of claim 2 wherein the at least one smart thermal barrier is an insulator below the transition temperature range and a conductive metal above the transition temperature range.

5. The magnetic device of claim 2 wherein the at least one smart thermal barrier includes at least one of vanadium oxide, $V_{1-x}Cr_xO_2$, $MoO_2$, $MnO_2$, $Ru_2Mn_{1-y}Ti_yGe$, $SrIrO_3$, $La_{0.7}Sr_{0.3}MnO_3$, $Ba_2FeReO_6$, $La_{2/3}TiO_3$ and $Ba_{0.2}Sr_{0.8}TiO_3$, where x is less than one and y is less than one.

6. The magnetic device of claim 1 wherein the magnetic junction includes a top, a bottom and a plurality of sides and wherein the at least one smart thermal barrier includes at least one of a smart thermal seed layer on which the bottom of the magnetic junction resides, a smart thermal capping layer on the top of the magnetic junction, and a smart thermal refill structure surrounding at least a portion of the plurality of sides.

7. The magnetic device of claim 6 wherein the smart thermal barrier includes the smart thermal refill structure and wherein the magnetic device further includes:
   at least one insulator between the plurality of sides and the smart thermal refill structure.

8. The magnetic device of claim 1 wherein the free layer has a magnetic thermal stability coefficient having a plurality of magnetic thermal stability coefficient phases, a first phase magnetic thermal stability coefficient of the plurality of magnetic thermal stability coefficient phases having a first slope below a first temperature, a second phase magnetic thermal stability coefficient of the plurality of magnetic thermal stability coefficient phases having a second slope above the first temperature and below a second temperature, the second temperature being greater than the first temperature, the magnetic thermal stability coefficient being zero above the second temperature and greater than zero below the second temperature, the first slope and second slope being unequal at the first temperature.

9. The magnetic junction of claim 1 wherein the free layer has a gradient in a magnetic ordering temperature such that at least a first portion of the free layer has at least a first magnetic ordering temperature higher than a second magnetic ordering temperature of a second portion of the free layer, the at least the first portion of the free layer being closer to the at least one reference layer than the second portion of the free layer.

10. An electronic device comprising:
    a magnetic memory including a plurality of magnetic storage cells and a plurality of bit lines, each of the plurality of magnetic storage cells including at least one magnetic junction and at least one smart thermal barrier, the magnetic junction including at least one reference layer, at least one nonmagnetic spacer layer, and a free layer, the at least one nonmagnetic spacer layer being between the free layer and the at least one reference layer, the free layer being switchable between a plurality of stable magnetic states when a write current is passed through the magnetic junction, the at least one smart thermal barrier being thermally coupled with the magnetic junction, the at least one smart thermal barrier having a low heat conductance below a transition temperature range, and a high heat conductance above the transition temperature range.

11. The electronic device of claim 10 wherein the at least one smart thermal barrier is an insulator below the transition temperature range and a conductive metal above the transition temperature range.

12. The electronic device of claim 11 wherein the at least one smart thermal barrier includes at least one of vanadium oxide, $V_{1-x}Cr_xO_2$, $MoO_2$, $MnO_2$, $Ru_2Mn_{1-y}Ti_yGe$, $SrIrO_3$, $La_{0.7}Sr_{0.3}MnO_3$, $Ba_2FeReO_6$, $La_{2/3}TiO_3$ and $Ba_{0.2}Sr_{0.8}TiO_3$, where x is less than one and y is less than one.

13. The electronic device of claim 10 wherein the magnetic junction includes a top, a bottom and a plurality of sides and wherein the at least one smart thermal barrier includes at least one of a smart thermal seed layer on which the bottom of the magnetic junction resides, a smart thermal capping layer on the top of the magnetic junction, and a smart thermal refill structure surrounding at least a portion of the plurality of sides.

14. The electronic device of claim 13 wherein the smart thermal barrier includes the smart thermal refill structure and wherein the magnetic device further includes:
    at least one insulator between the plurality of sides and the smart thermal refill structure.

15. A method for programming a magnetic device comprising:
    driving a write current through at least a portion of the magnetic device, the magnetic device including a magnetic junction and at least one smart thermal barrier thermally coupled with the magnetic junction, the magnetic junction including at least one reference layer, a free layer switchable between a plurality of stable magnetic states when the write current is passed through the magnetic junction and at least one nonmagnetic spacer layer between the free layer and the at least one reference layer, the at least one smart thermal barrier having a low heat conductance below a transition temperature range, and a high heat conductance above the transition temperature range;
    wherein the write current passes through the magnetic junction and raises a temperature of the at least one smart thermal barrier to above the transition temperature range.

16. The method of claim 15 wherein the at least one smart thermal barrier is an insulator below the transition temperature range and a conductive metal above the transition temperature range.

17. The method of claim 16 wherein the at least one smart thermal barrier includes at least one of vanadium oxide, $V_{1-x}Cr_xO_2$, $MoO_2$, $MnO_2$, $Ru_2Mn_{1-y}Ti_yGe$, $SrIrO_3$, $La_{0.7}Sr_{0.3}MnO_3$, $Ba_2FeReO_6$, $La_{2/3}TiO_3$ and $Ba_{0.2}Sr_{0.8}TiO_3$, where x is less than one and y is less than one.

18. The method of claim 15 wherein the magnetic junction includes a top, a bottom and a plurality of sides and wherein the at least one smart thermal barrier includes at least one of a smart thermal seed layer on which the bottom of the magnetic junction resides, a smart thermal capping layer on the top of the magnetic junction, and a smart thermal refill structure surrounding at least a portion of the plurality of sides.

19. The method of claim 18 wherein the smart thermal barrier includes the smart thermal refill structure and wherein the magnetic device further includes:
at least one insulator between the plurality of sides and the smart thermal refill structure.

20. The method of claim 15 wherein the free layer has at least one of a magnetic thermal stability coefficient having a plurality of magnetic thermal stability coefficient phases and a gradient in a magnetic ordering temperature, a first phase magnetic thermal stability coefficient of the plurality of magnetic thermal stability coefficient phases having a first slope below a first temperature, a second phase magnetic thermal stability coefficient of the plurality of magnetic thermal stability coefficient phases having a second slope above the first temperature and below a second temperature, the second temperature being greater than the first temperature, the magnetic thermal stability coefficient being zero above the second temperature and greater than zero below the second temperature, the first slope and second slope being unequal at the first temperature, the gradient in a magnetic ordering temperature being such that at least a first portion of the free layer has at least a first magnetic ordering temperature higher than a second magnetic ordering temperature of a second portion of the free layer, the at least the first portion of the free layer being closer to the at least one reference layer than the second portion of the free layer.

* * * * *